United States Patent
Mori

(10) Patent No.: US 8,949,301 B2
(45) Date of Patent: Feb. 3, 2015

(54) NUMERICALLY CONTROLLED OSCILLATOR AND OSCILLATION METHOD FOR GENERATING FUNCTION VALUES USING RECURRENCE EQUATION

(75) Inventor: Ryosuke Mori, Chiba (JP)

(73) Assignee: MegaChips Corporation, Osaka-shi (JP)

( * ) Notice: Subject to any disclaimer, the term of this patent is extended or adjusted under 35 U.S.C. 154(b) by 994 days.

(21) Appl. No.: 13/047,560

(22) Filed: Mar. 14, 2011

(65) Prior Publication Data

US 2011/0231693 A1   Sep. 22, 2011

(30) Foreign Application Priority Data

Mar. 16, 2010   (JP) .................... 2010-058634

(51) Int. Cl.
  *G06F 1/02*   (2006.01)
  *H03L 7/099*   (2006.01)
(52) U.S. Cl.
  CPC ..................... *H03L 7/0991* (2013.01)
  USPC ......................................... 708/270; 708/276
(58) Field of Classification Search
  CPC ............... H03L 7/0994; H03B 28/00
  USPC ......................... 708/270, 271, 276
  See application file for complete search history.

(56) References Cited

U.S. PATENT DOCUMENTS

| | | | |
|---|---|---|---|
| 3,971,998 A * | 7/1976 | Gopinath et al. ............... 327/46 |
| 5,517,535 A * | 5/1996 | Kroeger et al. ............... 375/373 |
| 6,166,568 A * | 12/2000 | Korsfeldt ....................... 327/105 |
| 6,380,875 B2 * | 4/2002 | Honkanen et al. ............. 341/144 |
| 7,702,034 B1 * | 4/2010 | Haddadin et al. ............. 375/308 |
| 7,724,097 B2 * | 5/2010 | Carley et al. .................... 331/74 |
| 2003/0041667 A1 * | 3/2003 | White ........................ 73/504.12 |
| 2007/0040589 A1 | 2/2007 | Matoba |
| 2008/0122496 A1 * | 5/2008 | Wagner ........................ 327/107 |

FOREIGN PATENT DOCUMENTS

| | | |
|---|---|---|
| JP | 1-207811 | 8/1989 |
| JP | 4-302511 | 10/1992 |
| JP | 2008-123350 | 5/2008 |
| JP | 2008-131280 | 6/2008 |
| WO | WO 2005/073829 A1 | 8/2005 |

OTHER PUBLICATIONS

Office Action issued Jan. 14, 2014 in Japanese patent Application No. 2010-058634 (with English translation).

* cited by examiner

*Primary Examiner* — Chuong D Ngo
(74) *Attorney, Agent, or Firm* — Oblon, Spivak, McClelland, Maier & Neustadt, L.L.P.

(57) ABSTRACT

Numerically controlled oscillators and oscillation methods for generating function values in respective clock cycles by using a recurrence equation are provided. The oscillation circuit generates, in each of the clock cycles, a current one of the function values by multiplying, using a multiplier having a latency of k clock cycles, a first one of the function values generated in a first one of the clock cycles that is j cycles before a current one of the clock cycles by a coefficient and adding an output of the multiplier and at least one of the function values generated in previous ones of the clock cycles that are 1 to i−1 cycles before the current one of the clock cycles excluding the first one of the clock cycles, where 2<i, 1<j<i, and 0<k<j.

24 Claims, 7 Drawing Sheets

(A) *1 when equation (7) is used, *(−1) when equation (8) is used
(B) $M_- = 2\{\cos(2\Delta\omega) - \cos(\Delta\omega)\}$ when equation (7) is used
$M_+ = 2\{\cos(2\Delta\omega) + \cos(\Delta\omega)\}$ when equation (8) is used $M = 2\cos(\Delta\omega)$ (A) $*1$ when equation (7) is used, $*(-1)$ when equation (8) is used
(B) $M_- = 2[\cos(2\Delta\omega) - \cos(\Delta\omega)]$ when equation (7) is used
$M_+ = 2[\cos(2\Delta\omega) + \cos(\Delta\omega)]$ when equation (8) is used (A) ∗1 when equation (7) is used, ∗(−1) when equation (8) is used
(B) M_ = 2{cos(2Δω) − cos(Δω)} when equation (7) is used
    M+ = 2{cos(2Δω) + cos(Δω)} when equation (8) is used (A) *1 when equation (7) is used, *(−1) when equation (8) is used
(B) $M_- = 2[\cos(2\Delta\omega) - \cos(\Delta\omega)]$ when equation (7) is used
$M_+ = 2[\cos(2\Delta\omega) + \cos(\Delta\omega)]$ when equation (8) is used without coeffient correction circuit with coeffient correction circuit

NUMERICALLY CONTROLLED OSCILLATOR AND OSCILLATION METHOD FOR GENERATING FUNCTION VALUES USING RECURRENCE EQUATION

This application claims benefit of Japanese Patent Application No. JP-A-2010-58634. The disclosure of the prior application is hereby incorporated by reference in its entirety.

BACKGROUND

This disclosure relates to numerically controlled oscillators that generate function values in each clock cycle (or in each sampling cycle) by using a (i−1)th order recurrence equation, where i is an integer equal to or greater than 3.

Demands for frequency-adjustable sinusoidal wave signals with high spectrum purity are high for various systems such as digital modulation/de-modulation communication systems. Voltage-controlled oscillators (VCOs) used in phase-locked loops (PLLs) frequency synthesizers are well known. However, VCO is an analog circuit that can hardly get a benefit of area scaling even if miniaturization of semiconductor integrated circuits advances. Furthermore, lowering of power-supply voltage caused by the miniaturization makes the designing of analog circuit more-and-more difficult.

On the other hand, digital circuits can get full benefits of area scaling as the miniaturization advances. Further, lowering of power-supply voltage only has modest influences on the difficulty of designing digital circuits. Accordingly, NCOs (numerically controlled oscillators) that can generate sinusoidal wave signals using digital circuits draw increasing attentions.

A voltage-controlled oscillator outputs sinusoidal wave signals having frequencies determined by an input voltage, while a numerically controlled oscillator outputs sinusoidal signals expressed by discrete digital values having adjustable frequencies determined by input numerals. Signal-processing algorithms utilized in numerically controlled oscillators may be implemented as hardware devices and also as software algorithms. Accordingly, numerically controlled oscillators have a wide range of utilizations.

However, numerically controlled oscillators, which can only generate signals that are discrete in time, have difficulties in generating high-frequency signals because their operations are limited by the operation speed of logic circuits or the calculation speed of the software. The sampling theorem of discrete signals limits the output frequency of sinusoidal signal as high as about a few hundred mega hertz with the clock frequencies of current semiconductor integrated circuits. Further, internal calculation for sinusoidal wave signal generation algorithm is performed using quantized values. Accordingly, a numerically controlled oscillator may generate a signal that is significantly different from an ideal sinusoidal signal due to an accumulation of quantization errors during the calculations.

<First Related Art (Table Look-Up Method)>

Function values of sinusoidal wave signal are stored in a look-up table and read the function values stored at an address indicated by a pointer while updating the pointer in each clock cycle. Specifically, a sequence of function values, for example, $\cos(0)$, $\cos(1*\Delta\omega)$, $\cos(2*\Delta\omega)$, $\cos(3*\Delta\omega)$, . . . is stored in the look-up table. The address increases in each clock cycle and, when reached to a final value, returns to an initial value and increases again.

<Second Related Art (CORDIC Algorithm)>

A rotation angle per a sampling period $\Delta\omega$ may be decomposed as:

$$\Delta\omega = \sum_{k=0}^{m-1} w_k c_k \tag{1}$$

Here, $c_k$ is 1 or −1, and $w_k = \arctan(1/2^k)$. A rotation matrix can be expressed as:

$$\prod_{k=0}^{m-1} \begin{bmatrix} \cos w_k & \sin w_k \\ -\sin w_k & \cos w_k \end{bmatrix} = \prod_{k=0}^{m-1} \cos w_k \begin{bmatrix} 1 & \tan w_k \\ -\tan w_k & 1 \end{bmatrix} \tag{2}$$

$$= \prod_{k=0}^{m-1} \cos w_k \begin{bmatrix} 1 & c_k/2^k \\ -c_k/2^k & 1 \end{bmatrix}$$

Generating, from an original coordinate vector $(\cos\omega, \sin\omega)$, a next coordinate vector $(\cos(\omega+\Delta\omega), \sin(\omega+\Delta\omega))$ may be performed by multiplying the original coordinate vector by the rotation matrix (2).

Generation of the next coordinate vector may be implemented in digital circuitry or in software with m sets of calculations each including one-bit shift and a addition/subtraction except for the multiplication by $\cos w_k$. The value m may be made larger in order to improve a resolution of rotation angle. The m sets of calculations may be repeated for each sampling period to generate, for example, a sequence of values $\cos(0)$, $\cos(1*\Delta\omega)$, $\cos(2*\Delta\omega)$, $\cos(3*\Delta\omega)$, . . . from x-coordinate of the coordinate vector.

The term of $\cos w_k$ in equation (2) may be uniquely determined if the value m is determined. Accordingly, a correction with $\cos w_k$ may be made at the final stage of calculation in each sampling period by one multiplication.

<3rd Related Art (Patent Document 1: US Patent Publication 2007-0040589)>

This technique utilizes a loop based on trigonometric identities such as shown in equation (3).

$$\cos(\omega+(n+1)\Delta\omega)=2\cos(\Delta\omega)\cos(\omega+n\Delta\omega)-\cos(\omega+(n-1)\Delta\omega) \tag{3}$$

Here, n is an integer equal to or lager than 1. By substituting $M=2\cos(\Delta\omega)$ and $a_n=\cos(\omega+n\Delta\omega)$, equation (3) may be expressed as (4), which is a recurrence equation between three successive terms, or a 2nd order recurrence equation.

$$a_{n+1}=Ma_n-a_{n-1} \tag{4}$$

Equation (4) indicates that the (n+1)th sinusoidal wave value can be calculated from the (n−1)th and n-th sinusoidal wave values and a coefficient M. Equation (4) may be expressed with a block diagram of a signal processing system show in FIG. 1. The system shown in FIG. 1 includes one-sampling-period delay elements 11 and 12, multiplier 21, adder 31, and a rounding circuit 41. When implementing the system with hardware, the delay elements 11 and 12 may be substituted with flip-flops.

According to the first related art, for example, 10 MHz sinusoidal wave may be expressed with 100 MHz sampling frequency by preparing a look-up table that stores a sequence of sinusoidal values at ten different phases $\cos(2\pi*0/10)=1$, $\cos(2\pi*1/10)$, $\cos(2\pi*2/10)$, $\cos(2\pi*3/10)$, . . . $\cos(2\pi*9/10)$. However, spectrum of quantized sinusoidal wave having such a simple periodicity is known to have harmonic components at second, third, and higher harmonic frequencies due to quantization errors. That is, spectrum quality of the sinusoidal wave signal may be low. Such sinusoidal signals with harmonic components are not suitable for applications such as digital modulation/de-modulation systems.

On the other hand, in order to express 9 MHz sinusoidal wave with 100 MHz sampling frequency, the look-up table is required to store a sequence of sinusoidal values at 100 different phases $\cos(2\pi*0*9/100)=1$, $\cos(2\pi*1*9/100)$, $\cos(2\pi*2*9/100)$, $\cos(2\pi*3*9/100)$, ... $\cos(2\pi*99*9/100)$. In this case, periodicity of quantization errors in frequency domain is lowered and amounts of harmonic components are lowered. Accordingly, suitability for applications such as digital modulation/de-modulation system is improved.

However, the longer the repetition cycle of quantization errors, the larger the size of look-up table and required resources. Further, numerically controlled oscillators are designed to generate sinusoidal wave with arbitrary frequencies. In order to increase the degree of arbitrariness, the size of look-up table further increases.

In the second related art of CORDIC algorithm, rotation angle $\Delta\omega$ may be determined arbitrarily by increasing the value of m. Accordingly, compared with the first related art, the problem of incorporation of harmonic components may be prevented.

However, as equation (2) indicates, m sets of calculations each including a bit-shift and an addition/subtraction and a multiplication to cancel the coefficient of $1/\cos w_k$ are required to be performed to the current sinusoidal wave value for generating the next sinusoidal wave value. Further, because the coordinate vector $(\cos\omega, \sin\omega)$ is utilized, both sine and cosine values are required and amount of calculation in each sampling period becomes large.

Accordingly, the maximum available amount of calculation limits the sampling frequency. According to the sampling theorem of discrete signals, the limitation of sampling frequency limits the frequency of output sinusoidal wave. Thus, CORDIC algorithm may be suitably used to generate sine or cosine values at a specified angle, but is not suitably used in numerically controlled oscillators. Further, CORDIC algorithm generates the next sinusoidal wave value by multiplying the rotation vector to the current sinusoidal wave value. Because the current sinusoidal wave value is a quantized value, accumulation of quantization errors may distort output sinusoidal wave. For example, the amplitude of output sinusoidal wave may change.

Utilizing the loop shown in FIG. 1 of Patent Document 1 enables to reduce necessary resources. Further, the problem of harmonic components due to the periodicity of quantization errors can be solved because the rotation angle $\Delta\omega$ per one sampling period may be set arbitrarily.

However, in the path shown by the arrow in FIG. 1 requires one multiplication and one addition/subtraction calculations, and these calculations are required to be performed within one sampling period. Accordingly, when a numerically controlled oscillator is implemented with hardware with the maximum clock frequency of about 200 MHz, for example, the sampling theorem of discrete signals limits the maximum frequency of output sinusoidal wave to about 100 MHz. Further, similar to the second related art, the third related art calculates the next sinusoidal wave value by using the previous sinusoidal wave value. Accordingly, the third related art also may have a problem of accumulation of quantization errors.

SUMMARY

It would be advantageous to provide numerically controlled oscillators and oscillation methods for generating function values that can generate high frequency outputs without requiring excessively high clock frequencies. It would be further advantageous to provide numerically controlled oscillators and oscillation methods for generating function values that are less susceptible to accumulation of quantization errors.

Various exemplary numerically controlled oscillators and oscillation methods for generating function values of this disclosure may implement recurrence equations in a manner that increases a time margin for executing a multiplication included in the equation. Various exemplary numerically controlled oscillators and oscillation methods for generating function values of this disclosure may further employ one or both of re-supplying of initial values and correction of coefficients that are used to generate the function values.

Various exemplary embodiments of this disclosure provide numerically controlled oscillators that generate function values in respective clock cycles by using recurrence equations. The numerically controlled oscillator may include an oscillation circuit that includes a multiplier having a latency of k clock cycles and an adder. The oscillation circuit generates, in each of the clock cycles, a current one of the function values by multiplying, using the multiplier, a first one of the function values generated in a first one of the clock cycles that is j cycles before a current one of the clock cycles by a coefficient and adding, using the adder, an output of the multiplier and at least one of the function values generated in previous ones of the clock cycles that are 1 to i−1 cycles before the current one of the clock cycles excluding the first one of the clock cycles. Here, i is an integer greater than 2, j is an integer greater than 1 and less than i, and k is an integer greater than 0 and less than j. The numerically controlled oscillator may further include a coefficient generation circuit that generates and supply the coefficient to the oscillation circuit.

According to some exemplary embodiments, the oscillation circuit may further includes i−1 stages of delay elements that successively delay the current one of the function values for one clock cycle in each of the stages, and an output of (j−k)th one of the delay elements may be input to the multiplier.

According to some exemplary embodiments, the coefficient generation circuit may generate the coefficient using a calculation formula selected from a plurality of formulae based on an oscillation frequency of the oscillation circuit.

According to some exemplary embodiments, the oscillation circuit may generate sinusoidal function values at phases with an interval of $\Delta\omega$ as the function values. Further, when i=5 and j=2, the coefficient may be $M_-=2\{\cos(2\Delta\omega)-\cos(\Delta\omega)\}$ and the adder may add two of the function values generated in two of the previous ones of the clock cycles that are one cycle before the current one of the clock cycles and three cycles before the current one of the clock cycles as they are and further adds one of the function values generated in one of the previous ones of the clock cycles that is four cycles before the current one of the clock cycles after a sign thereof is inverted. Alternatively, the coefficient may be $M_+=2\{\cos(2\Delta\omega)+\cos(\Delta\omega)\}$ and the adder may add three of the function values generated in three of the previous ones of the clock cycles that are one cycle before the current one of the clock cycles, three cycles before the current one of the clock cycles, and four cycles before the current one of the clock cycles after signs thereof are inverted.

According to some exemplary embodiments, the coefficient generating circuit may generate an internal coefficient including an upper portion having a first number of bits required by the multiplier and a lower portion having redundant bits. The coefficient generation circuit may further include a correction circuit that receives the internal coefficient, evaluates an accumulation of errors while the oscillation circuit generates the function values based on the lower portion of the internal coefficient to generates a correction value, and corrects the upper portion of the internal coefficient using the correction value to generate the coefficient having the first number of bits.

According to some exemplary embodiments, the numerically controlled oscillator may further includes an initial value generation circuit that generates and supplies initial values to the oscillation circuit so that the oscillation circuit starts generating the function values from the initial values. The initial value generation circuit may re-supply the initial values to the oscillation circuit when the clock cycle reaches to a returning clock cycle at which the function values are supposed to return to the initial values so that the oscillation circuit re-starts generating the function values from the initial values.

According to some exemplary embodiments, the oscillation circuit may include L oscillation circuits that generate the function values at phases successively shifted by $\Delta\omega$, and each of the L oscillation circuits generates the function values at phases with an interval of $\Delta\omega*L$. Here, L is an integer greater than 1. The numerically controlled oscillator may generate the function values at phases with an interval of $\Delta\omega$ by interleaving the function values generated by the L oscillation circuits.

Various exemplary embodiments of this disclosure provide oscillation methods for generating function values in respective clock cycles by using a recurrence equation. The oscillation methods may include generating a current one of the function values in each of the clock cycles by multiplying a first one of the function values generated in a first one of the clock cycles that is j cycles before a current one of the clock cycles by a coefficient with a latency of k clock cycles, and adding a result of the multiplying and at least one of the function values generated in previous ones of the clock cycles that are 1 to i−1 cycles before the current one of the clock cycles excluding the first one of the clock cycles. Here, i is an integer greater than 2, j is an integer greater than 1 and less than i, and k is an integer greater than 0 and less than j.

According to some exemplary embodiments, the oscillation method may further includes generating an internal coefficient including an upper portion having a first number of bits required as the coefficient and a lower portion having redundant bits, and evaluating an accumulation of errors while generating the function values based on the lower portion of the internal coefficient to generates a correction value, and correcting the upper portion of the internal coefficient using the correction value to generate the coefficient having the first number of bits.

According to some exemplary embodiments, the oscillation method may further includes supplying initial values so that the generating of the function values starts from the initial values, and re-supplying the initial values when the clock cycle reaches to a returning clock cycle at which the function values are supposed to return to the initial values so that the generating of the function values re-starts from the initial values.

BRIEF DESCRIPTION OF THE DRAWINGS

Various exemplary embodiments numerically controlled oscillators and oscillation methods for generating function values will be describe in detail with reference to the following figures, wherein.

DETAILED DESCRIPTION OF EMBODIMENTS

Similar to the third related art, various exemplary embodiments of this disclosure utilize loops of recurrence equations derives from trigonometric identities. As explained above, a primary drawback of the third relate art is that the maximum sampling frequency or the maximum frequency of output sinusoidal wave is limited due to the high amount of required arithmetic calculations.

Figure 1:
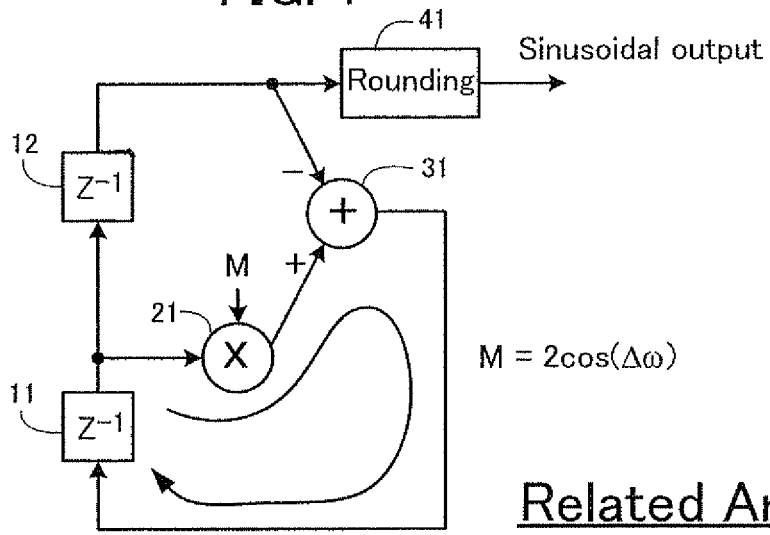
FIG. 1 is a block diagram of a conventional numerically controlled oscillator.

As evident from equation (1) and FIG. 1, the fundamental cause of this drawback is that the n-th sinusoidal wave value $a_n$ is used to calculate the (n+1)th sinusoidal wave value $a_{n+1}$. The calculation requires one multiplication with a coefficient M and one addition/subtraction. The number of stages of combinational logic, in a hardware implementation, or the calculation speed, in a software implementation, to perform this calculation limits the maximum frequency of the output sinusoidal wave. In other words, the maximum frequency of output sinusoidal wave may be increased by decreasing a required amount of calculations on the value $a_n$ to generate the value $a_{n+1}$.

This disclosure proposed to use the following trigonometric identities (5) or (6), instead of the trigonometric identity (3), to generate sinusoidal signals.

$$\cos(\omega + (n+1)\Delta\omega) = \\ \cos(\omega + n\Delta\omega) + 2\{\cos(2\Delta\omega) - \cos(\Delta\omega)\}\cos(\omega + (n-1)\Delta\omega) + \\ \cos(\omega + (n-2)\Delta\omega) - \cos(\omega + (n-3)\Delta\omega) \quad (5)$$

$$\cos(\omega + (n+1)\Delta\omega) = \\ -\cos(\omega + n\Delta\omega) + 2\{\cos(2\Delta\omega) + \cos(\Delta\omega)\}\cos(\omega + (n-1)\Delta\omega) - \\ \cos(\omega + (n-2)\Delta\omega) - \cos(\omega + (n-3)\Delta\omega) \quad (6)$$

Here, n≥3. Equations (5) and (6) may be viewed as following 4th order recurrence equations (7) and (8), or recurrence equations between five successive terms, i.e., terms including respective ones of the function values $a_{n-3}$, $a_{n-2}$, $a_{n-1}$, $a_n$, and $a_{n+1}$ generated in five successive cycles.

$$a_{n+1}=a_n+M_-a_{n-1}+a_{n-2}-a_{n-3} \quad (7)$$

$$a_{n+1}=-a_n+M_+a_{n-1}-a_{n-2}-a_{n-3} \quad (8)$$

Here, $M_-=2\{\cos(2\Delta\omega)-\cos(\Delta\omega)\}$, $M_+=2\{\cos(2\Delta\omega)+\cos(\Delta\omega)\}$ and $a_n=\cos(\omega+n\Delta\omega)$.

Compared with the equation (4) where $a_n$ is multiplied by a coefficient, $a_{n-1}$ is multiplied by the coefficient $M_-$ and $M_+$ in equations (7) and (8), respectively. Accordingly, different from the case shown in FIG. 1 where the operation path including one multiplication must be executed in one sampling period, a maximum allowable execution time of two sampling periods is provided for the operation path.

Figure 2:
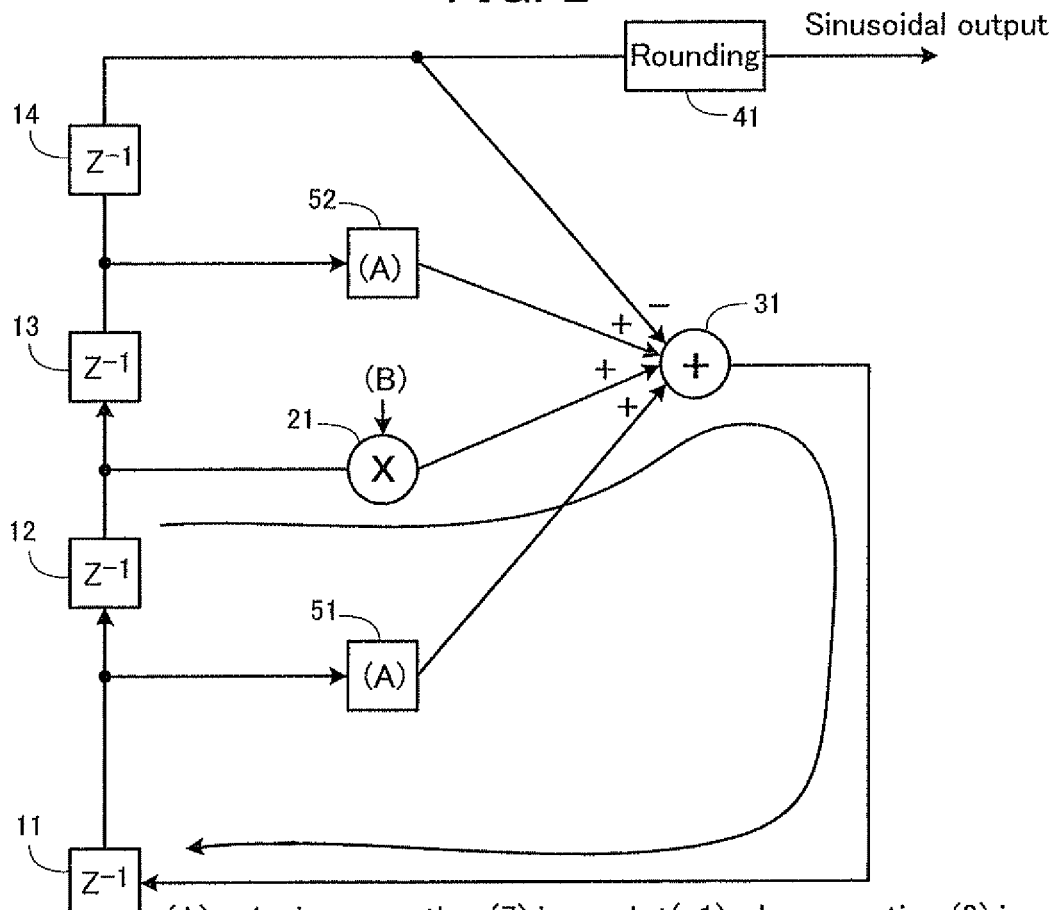
FIG. 2 is a block diagram of an improved numerically controlled oscillator based on the numerically controlled oscillator shown in FIG. 1.

Referring to the implementation of equation (4) shown in FIG. 1, equations (7) and (8) may be implemented as shown in FIG. 2. In FIG. 2, each of 11 to 14 represents a delay element of one sampling period, 21 represents a multiplier, 31 represents an adder, 41 represents a rounding circuit, and each of 51 and 52 represents a calculator. Each of 51 and 52 performs a calculation of *1 when the equation (7) is used and *(−1) when the equation (8) is used. A coefficient input to the multiplier 21 is $M_-=2\{\cos(2\Delta\omega)-\cos(\Delta\omega)\}$ when the equation (7) is used, and $M_+=2\{\cos(2\Delta\omega)+\cos(\Delta\omega)\}$ when the equation (8) is used.

However, the implementation shown in FIG. 2 still requires to execute the path including one multiplication in one sampling period so that the implementation represent the recurrence equations (7) and (8).

1st Exemplary Embodiment

FIG. 3

Figure 3:
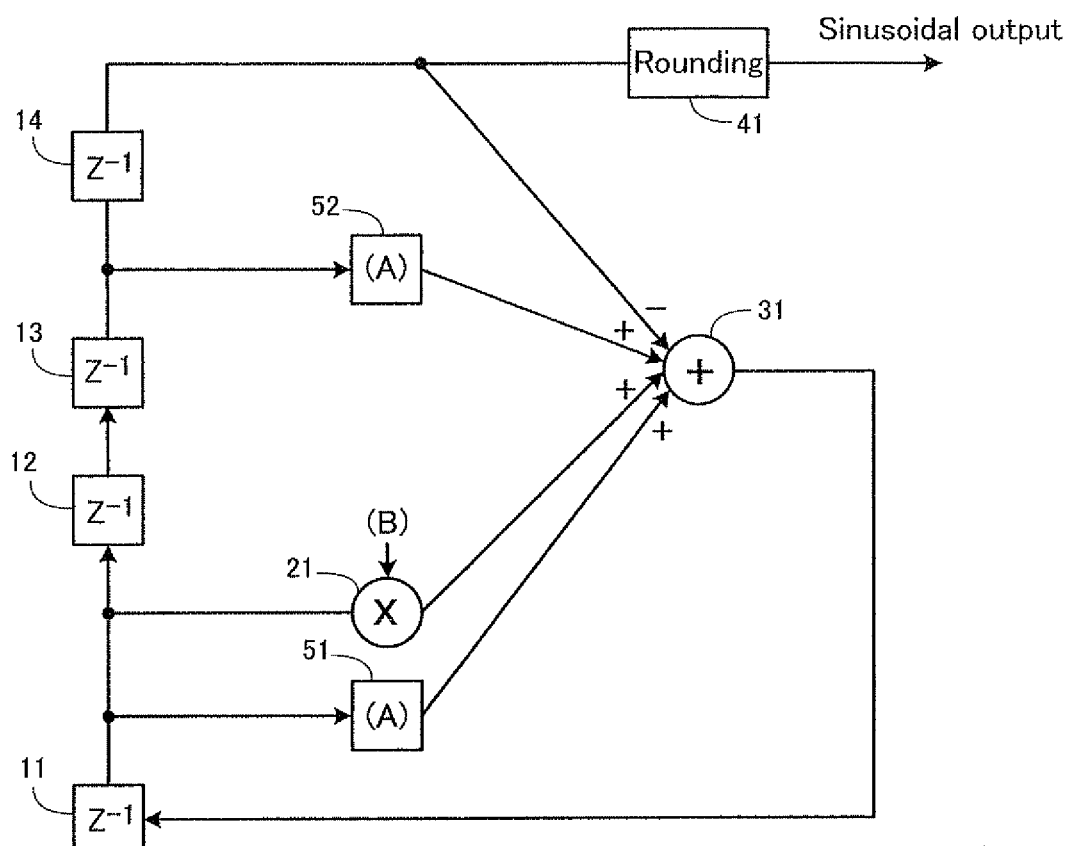
FIG. 3 is a block diagram of a first exemplary numerically controlled oscillator of this disclosure.

Accordingly, this disclosure proposes an implementation shown in FIG. 3, which is improved from the implementation shown in FIG. 2. Different from the implementation shown in FIG. 2 where an output from the 2nd-stage delay element 12 is input to the multiplier 21, the numerically controlled oscillator shown in FIG. 3 inputs an output of the 1st-stage delay element 11 to the multiplier 21. That is, in the implementation shown in FIG. 3, the value to be multiplied $a_{n-1}$ is input to the multiplier 21 earlier than the implementation shown in FIG. 2 by one sampling period.

Accordingly, the implementation shown in FIG. 3 represents the recurrence equation (7) and (8) if the path including a multiplier is executed in two sampling periods. In other words, the implementation shown in FIG. 3 provides one sampling period of margin for the execution of multiplication.

In hardware implementation, the multiplier 21 in FIG. 3 is pipelined with a latency of one-clock cycle. That is, the multiplication is divided into two stages wherein the second stage executes after receiving, by using a flip-flop, a result of execution of the first stage. If the maximum amount of arithmetic execution in each stage in each sampling period is the same, pipelining of the multiplier 21 with a latency of one-clock cycle enables a two-fold increase of the maximum amount of execution. If the amount of arithmetic execution in one sampling period is the same, pipelining of the multiplier 21 with a latency of one-clock cycle enables two-fold increase of the clock frequency.

Accordingly, using the recurrence equation (7) and (8) enables to shorten the sampling period and to increase the maximum frequency of output sinusoidal wave.

Here, it is proposed to use trigonometric identities (5) and (6), or a loop of 4th order recurrence equations between five successive terms (7) and (8), instead of identity (3), or a loop of a 2nd order recurrence equation between three successive terms (4). Thereby, a two-fold increase of the margin to execute a path including a multiplication is realized. Similarly, loops of recurrence equations between four or more terms may be utilized to increase the margin. For example, using a loop of 6th order recurrence equation, or a loop of a recurrence equation between seven successive terms, enables a three-fold increase of the margin compared with the case that a loop of 2nd order recurrence equation (4) between 3 successive terms is used.

Note that, however, a theorem (theorem (1)) of "a sequence of function values diverges unless absolute values of all complex solutions of a characteristic equation of a recurrence equation are equal to or less than 1" is known. For the equations (7) and (8), the characteristic equations are (9) and (10) below.

$$x^4-x^3-M_-x^2-x+1=0 \quad (9)$$

$$x^4+x^3-M_+x^2+x+1=0 \quad (10)$$

When an absolute value of any one of five solutions of the characteristic equations is less than one, it is impossible to keep absolute values of all other ones of the solutions equal to or less than one. Accordingly, the condition for stable operation of an oscillation circuit implementing the equations (7) and (8) is that absolute values of all five solutions of the characteristic equations are equal to one. More specifically, ranges of stable operations of oscillation circuits implementing the equations (7) and (8) are $-2 \leq M_- \leq 0$ and $-2 \leq M_+ \leq 0$, respectively.

As a numerically controlled oscillator suitable for applications that require a wide range of oscillation frequencies, it is desirable to cover an entire frequency range equal to or lower than a half of the sampling frequency by making the coefficients $M_-$ and $M_+$ variable. Here, sampling theorem of discrete signals limits the maximum frequency of output sinusoidal wave to "Nyquist frequency", which is a half of the sampling frequency.

However, it is impossible to cover the entire frequency range by using either of equation (7) or (8) alone. That is, the ranges of output sinusoidal wave frequency $F_{OSC}$ that satisfy the conditions $-2 \leq M_- \leq 0$ and $-2 \leq M_+ \leq 0$ are shown in the following equations (11) and (12), respectively, where $F_{NYQ}$ represents Nyquist frequency.

$$0 \leq F_{OSC} \leq F_{NYQ}/3 \text{ or } F_{NYQ}/2 \leq F_{OSC} \leq 2*F_{NYQ}/3 \quad (11)$$

$$F_{NYQ}/3 \leq F_{OSC} \leq F_{NYQ}/2 \text{ or } 2*F_{NYQ}/3 \leq F_{OSC} \leq F_{NYQ} \quad (12)$$

Nonetheless, combining the ranges that satisfy the equations (11) and (12) enables to cover the entire frequency range equal to or lower than $F_{NYQ}$. Accordingly, a numerically controlled oscillator may preferably be implemented by switching between equations (7) and (8) depending on desired output sinusoidal wave frequency. That is, it is preferable to implement the construction shown in FIG. 3 as it is.

When trigonometric identities that can be expressed as 5th or higher order recurrence equations between six or more successive terms are implemented, frequency ranges that satisfy the theorem (1) are narrowed. Nonetheless, such implementations may be acceptable for applications that do not necessary to cover the entire frequency range equal to or lower than $F_{NYQ}$.

Second Exemplary Embodiment

Figure 4:
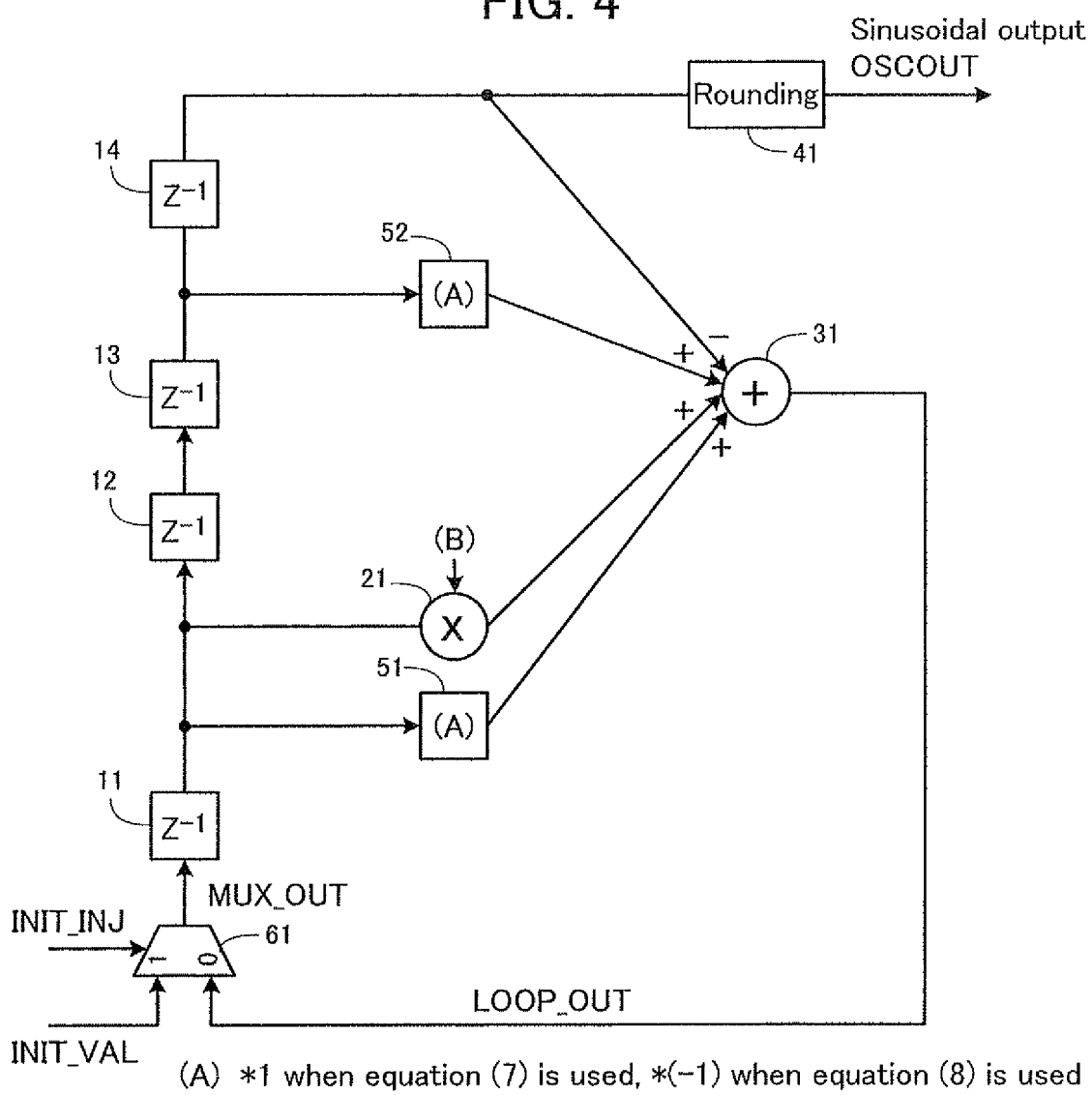
FIG. 4 is a block diagram of a second exemplary numerically controlled oscillator of this disclosure.
Figure 5:
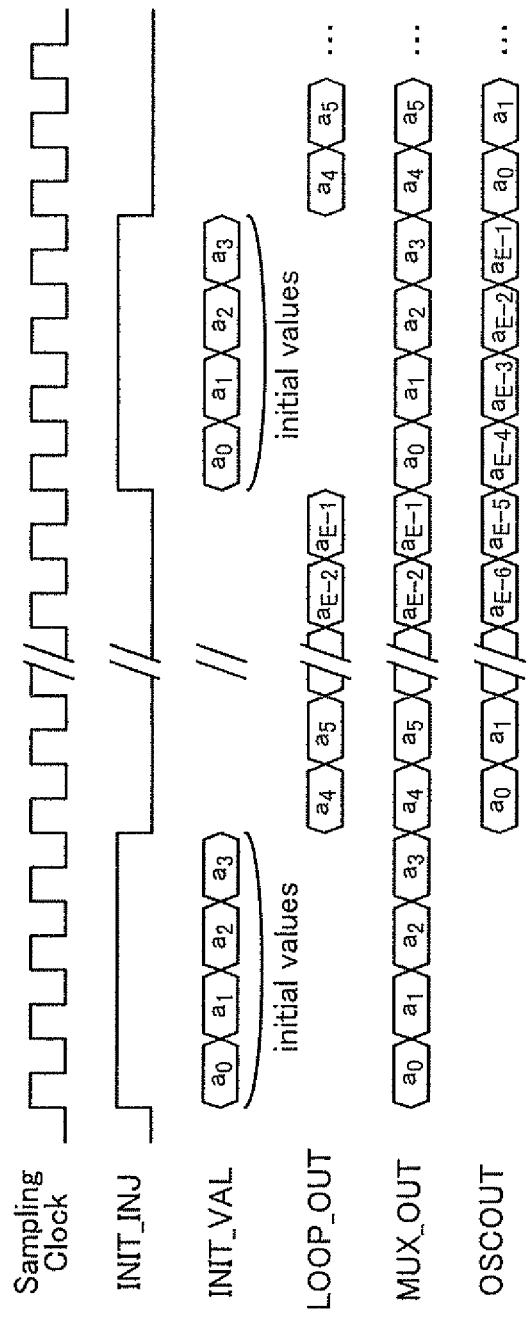
FIG. 5 is a timing chart showing an operation of the second exemplary numerically controlled oscillator.

FIGS. 4 and 5

Frequency and amplitude of output signals of a numerically controlled oscillator vary depending on input values.

For example, coefficient M and initial values $a_0$ and $a_1$ determine output sinusoidal wave frequency and amplitude, respectively, of a numerically controlled oscillator that implements recurrence equation (4). Similarly, coefficients $M_-$ and $M_+$ and initial values $a_0$, $a_1$, $a_2$ and $a_3$ determine output sinusoidal wave frequency and amplitude, respectively, of a numerically controlled oscillator that implements recurrence equations (7) and (8).

These coefficients and initial values are required to be stores in, for example, a look-up table before a numerically controlled oscillator starts generating function values. When a recurrence equation including a larger number of terms is implemented, a larger number of initial values are required to be stored in a look-up table. As a result, a larger amount of resources are required for the look-up table. A still larger amount of resources are required for generating signals having variable frequencies with finer steps.

However, many applications of numerically controlled oscillators permit a certain start-up period before starting to output generated signals. Accordingly, this disclosure proposes to utilize a low-speed initial value generation circuit that generates coefficients and initial values during the start-up period, or during other idle periods. For example, a low-speed initial value generation circuit that generates the coefficient $M_-$, the initial values $a_0$, $a_1$, $a_2$ and $a_3$ by using equation (3) may be employed in combination with a high-speed main oscillation circuit that implements recurrence equation (7).

For example, by only storing beforehand the values $a_0=\cos(0)=1$ and $a_1=\cos(\Delta\omega)$ in a look-up table, the initial value generation circuit may calculate $a_2=\cos(2\Delta\omega)$, $a_3=\cos(3\Delta\omega)$ in the start-up period and store the calculated values in the look-up table. The low-speed initial value generation circuit may also calculate and store the coefficient $M_-=2*(a_2-a_1)$. Then, the high-speed main oscillation circuit can start generating function values using these initial values that the low-speed initial value generation circuit calculated and stored.

Interleaving outputs of a plurality of main oscillation circuits may further increase the maximum frequency of output sinusoidal wave. That is, L main oscillation circuits each operating with a sampling frequency of $F_{SAMP}$ may be provided. L main oscillation circuits generate function values at phases successively shifted with each other by $\Delta\omega$, and each of the main oscillation circuits generates function values at phases with $\Delta\omega*L$ interval. Interleaving output signals of these L main oscillation circuits, each having a Nyquist frequency of $F_{NYQ}$, makes an interleaved output signal having a Nyquist frequency, or the maximum frequency, of $L*F_{NYQ}$.

All of these L main oscillation circuits may share the same coefficient $M_-$. The first one of the main oscillation circuits requires initial values $a_0$, $a_L$, $a_{2L}$, and $a_{3L}$, the second one of the main oscillation circuits requires initial values $a_{0+1}$, $a_{L+1}$, $a_{2L+1}$, and $a_{3L+1}$, ... and L-th one of the main oscillation circuits requires initial values $a_{L-1}$, $a_{2L-1}$, $a_{3L-1}$, and $a_{4L-1}$. That is, the L main oscillation circuits require 4*L initially values in total. Nonetheless, it is not required to store all of these initial values in a look-up table beforehand. The initial value generation circuit described above may calculate and store the initial values during the start-up period.

The L-time interleaving requires almost L-times circuit resources, but realizes an L-fold increase of the maximum frequency of output sinusoidal wave without increasing the maximum operation frequency of each main oscillation circuit. The increase of the maximum output frequency by implementing higher order recurrence equations between larger numbers of successive terms described above may be combined with the interleaving. Specific implementations may be determined depending on factors such as maximum available circuit resources and required maximum output frequency range.

The second primary problem of sinusoidal wave generation by using recurrence equations is accumulation of quantization errors, as explained as problems of the second and the third related arts. Calculations between a sequence of function values $a_n$ and coefficients M, $M_-$, and $M_+$ having infinite resolutions do not cause such a problem, because trigonometric identities (3), (5), and (6) are always satisfied mathematically.

However, actual hardware or software implementations are realized as a quantized calculation loop, or a calculation loop having limited resolutions. That is, a rounded sinusoidal wave value of the current cycle is calculated based on sinusoidal wave values calculated in previous cycles, which are rounded values. Accordingly, rounding errors may be accumulated and, in average, the function values may depart from desired sinusoidal wave values.

In order to address this problem, International Publication WO 2005/073829 proposes a method for generating complex sinusoids that includes substituting a complementary component of unity amplitude if a zero value condition exists. However, this method requires a detection circuit to detect the zero value condition.

This disclosure proposes, in order to address the problem of accumulation of rounding errors, a periodic re-supplying of initial values to the oscillation circuit. For example, when sinusoidal wave having a frequency of 9 MHz are generated based on 100 MHz sampling frequency, a sequence of sinusoidal value generated by ideal calculations having an infinite resolution has a periodicity of 100 sampling periods. Accordingly, each of groups of values in the sequence $a_0$, $a_{100}$, $a_{200}$ ..., and $a_1$, $a_{101}$, $a_{201}$ ..., and so on, are supposed to be completely matched with each other.

In actual quantized calculations, however, these values in each group may not be completely matched with each other due to the accumulation of quantization errors. The problem of accumulation of quantization errors can be solved by re-supplying the initial values, which may be calculated and stored by the initial value generation circuit, in the recurrence equation loop in stead of the values $a_{100}$, $a_{101}$, ... and $a_{200}$, $a_{201}$, ... and so on, which are generated after repeated calculations.

A block diagram of an improved exemplary implementation of recurrence equations (7) and (8), which includes the re-supplying of initial values, is shown in FIG. 4. Different from the implementation shown in FIG. 3, the oscillator shown in FIG. 4 includes a selector 61 before the input of the first-stage delay element 11. At a timing determined by an initial values inputting period determination signal INIT_INJ, the selector 61 selects the initial values INIT_VAL, which are calculated and stored by the initial value generation circuit, to input in the recurrence equation loop. At other timings, the selector selects an output LOOP_OUT of the adder 31 as an input to the delay element 11 so that the recurrence equation loop generates a sequence of values.

FIG. 5 shows a timing chart of an oscillation sequence of the construction shown in FIG. 4, where a cycle of the sequence of output sinusoidal wave is assumed to be E sampling periods. At first, the initial values inputting period determination signal INIT_INJ becomes high level, and initial values $a_0$, $a_1$, $a_2$, $a_3$ are input. Thereafter, INIT_INJ keeps low level and generation of function values continues until the function value $a_{E-1}$ is generated. Then, when the clock cycle reaches to cycles that the values are supposed to return to the initial values, INIT_INJ again becomes high level and the same initial values are input.

In a hardware implementation, delay elements 11 to 14 may be flip-flops. The initial values inputting period determination signal INIT_INJ, which determines the timing of inputting initial values, may be generated by using, for example, a simple binary counter if the cycle E is know.

The oscillation circuit shown in FIG. 4 further includes a rounding circuit 41 so that the oscillation circuit outputs sinusoidal wave after rounding the outputs of the recurrence equation loop. The oscillation circuit shown in FIG. 3 may also include a rounding circuit. That is, function values $a_n$ generated by recurrence equation loops of the oscillation circuits shown in FIGS. 3 and 4 may have a bit length longer than a length required as output sinusoidal wave values. The values are output after being rounded in the required bit length by the rounding circuit 41.

When the cycle E becomes long, a frequency of re-supplying initial values decreases and an amount of accumulated errors just before re-supplying initial values may become large. However, increasing the bit length of function values $a_n$ in the sequence longer than a length required to express the output sinusoidal wave signal and rounding the values before outputting as output sinusoidal wave may prevent increasing the amount of accumulated errors. As a result, output sinusoidal wave having a desired frequency may be expressed with a sequence $a_n$ having a long cycle.

Third Exemplary Embodiment

Figure 6A:
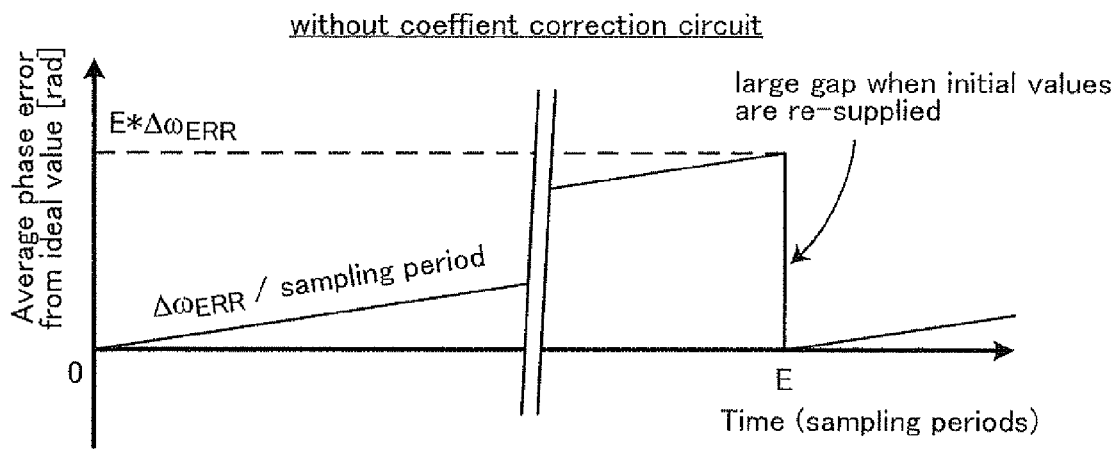
FIG. 6A is a graph that shows an accumulation of error in the phase when a coefficient correction algorithm is not used.
Figure 6B:
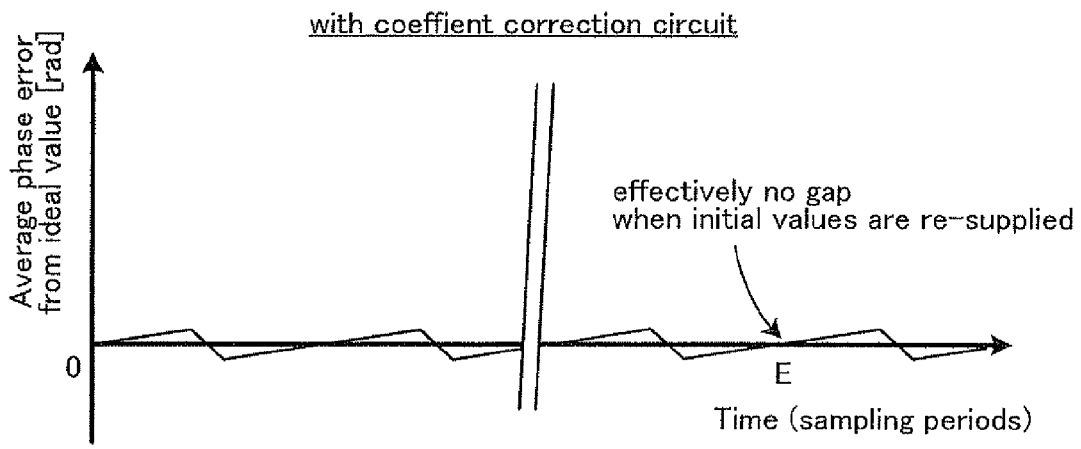
FIG. 6B is a graph that shows an effect of the coefficient correction circuit in the third exemplary numerical controlled oscillator.
Figure 7:
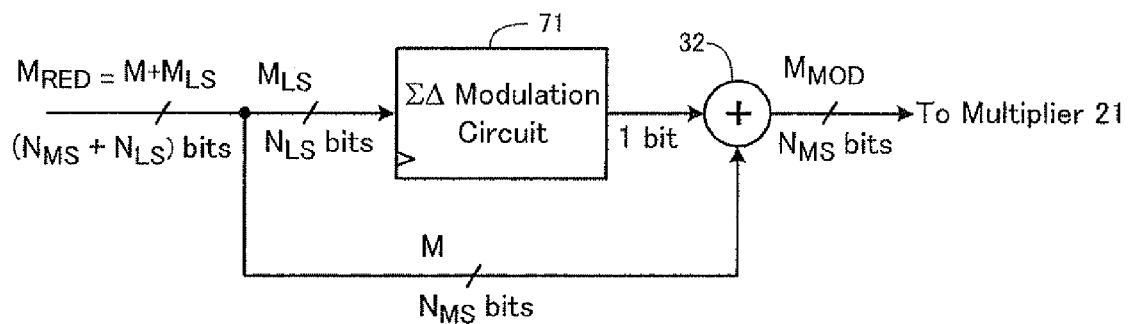
FIG. 7 is a block diagram of a coefficient correction circuit in a third exemplary numerically controlled oscillator of this disclosure.

FIGS. 6 and 7

As explained above, this disclosure proposes periodic re-supplying of initial values in order to solve the problem of accumulation of quantization errors. This measure, however, may cause another problem, or a problem of frequency error due to the quantized coefficient. That is, because the coefficients M in equation (4) and M_ and M_+ in equations (7) and (8) are quantized values, an error in the frequency of output sinusoidal wave due to quantization errors in the coefficients may be accumulated. The re-supplying of initial values cancels the frequency error, but may generate a gap between function values of the output sinusoidal wave value. That is, the function value just after the re-supplying of initial values may be discontinuous from the value just before the re-supplying.

The problem is schematically shown in FIG. 6A. Assuming that a cycle of the sequence of output sinusoidal wave value is E sampling periods, the sinusoidal wave value after E sampling periods from the start of oscillation, or just before the re-supplying of initial values, departs from an ideal value by about $E*\Delta\omega_{ERR}$, in average. Here, $\Delta\omega_{ERR}$ represents a difference of quantized differential phase $\Delta\omega$ from an ideal differential phase $\Delta\omega_{IDEAL}$, which has an infinite resolution. That is, when the recurrence equation (4) is implemented, an average gap in the phase $\omega_{GAP}$ after E sampling periods may be represented by following equation (13) where $M_{IDLE}$ is an ideal value of the coefficient M.

$$\omega_{GAP} \cong E*\Delta\omega_{ERR} \qquad (13)$$
$$= E*(\Delta\omega_{IDEAL} - \Delta\omega)$$
$$= E*(\arccos(M_{IDEAL}/2) - \arccos(M/2))$$

As can be seen from equation (13), the value $\omega_{GAP}$ changes depending on how much the quantized differential phase $\Delta\omega$ differs from the ideal differential phase $\Delta\omega_{IDEAL}$, or how many bits are used to express the coefficient M, or M_ and M_+. The value $\omega_{GAP}$ further changes depending on the frequency of output signal, even if the number of bits to express the coefficient is fixed. Equation (13) further indicates that the value $\omega_{GAP}$ increases when the cycle E increases. However, a longer cycle E is desired to generate a sequence of sinusoidal wave values having a longer cycle.

In order to overcome this problem, this disclosure proposes a coefficient correction algorithm that dynamically corrects the coefficient by applying sigma-delta ($\Sigma\Delta$) modulation. FIG. 7 shows an exemplary coefficient correction circuit. The correction circuit shown in FIG. 7 includes a $\Sigma\Delta$ modulation circuit 71 and an adder 32. The coefficient correction circuit receives a quantized input signal $M_{RED}=M+M_{LS}$ having a bit length of $N_{RED}=N_{MS}+N_{LS}$, where $N_{MS}$ is a bit length required for the coefficient and $N_{LS}$ is a bit length of redundant bits. The correction circuit outputs a result of the coefficient correction algorithm $M_{MOD}$ having the same bit length of $N_{MS}$ to the multiplier 21 as a corrected coefficient.

The coefficient correction circuit divides the upper portion M and the lower portion $M_{LS}$ of the input signal $M_{RED}$, and inputs the quantized value $M_{LS}$ into the $\Sigma\Delta$ modulation circuit 71. The $\Sigma\Delta$ modulation circuit 71 converts $N_{LS}$-bits digital values to 1-bit digital values. That is, the $\Sigma\Delta$ modulation circuit 71 includes an integrator and a comparator, and integrates the value $M_{LS}$, which is the lower $N_{LS}$-bits portion of the coefficient $M_{RED}$, and compares the result of integration with a threshold value. Then, the $\Sigma\Delta$ modulation circuit 71 outputs 1-bit digital value of +1 or 0 (or, 0 or −1). The coefficient correction circuit generates the corrected quantized value $M_{MOD}$ by adding the 1-bit output of the $\Sigma\Delta$ modulation circuit 71 and the $N_{MS}$-bits coefficient M.

Accordingly, an accumulation of errors during the generation of function values by the oscillation circuit is evaluated based on the value $M_{LS}$ having the redundant bit length, and 1-bit correction value is generated. The coefficient M is corrected by using the generated correction value and the correction coefficient $M_{MOD}$ is supplied to the multiplier 21.

Effect of the coefficient correction algorithm is shown in FIGS. 6A and 6B. When the coefficient correction algorithm is not employed, a coefficient M having a fixed quantization error, which is determined by the frequency of output sinusoidal wave, is continuously input to the multiplier 21. Accordingly, as shown in FIG. 6A, the error in the phase continuously accumulates to one direction, i.e., to the upper direction if the error in the differential phase per one sampling period $\Delta\omega_{ERR}$ is positive and to the lower direction if $\Delta\omega_{ERR}$ is negative. As a result, the accumulated error after E sampling periods becomes about $E*\Delta\omega_{ERR}$.

On the other hand, the coefficient correction algorithm corrects the accumulated error to an opposite direction when the accumulated error reaches a certain amount regardless of the direction of the accumulation. As a result, as shown in FIG. 6B, the coefficient correction algorithm effectively decrease the amount of accumulated error in the phase. Further, the coefficient correction algorithm makes the accumulated error after E sampling periods effectively zero, or at least within a limited amount.

Accordingly, the coefficient correction algorithm may be advantageously employed to suppress the amount of accumulated error due to the quantization error in the coefficient. The coefficient correction algorithm may further advantageously employed in combination with the periodic re-supplying of initial values. By combining the periodic re-supplying of initial values and the coefficient correction algorithm, the accumulation of quantization errors in the function values may effectively be suppressed without making a large gap.

The coefficient correction algorithm provides the same effect even if an operation frequency of the $\Sigma\Delta$ modulation circuit within the coefficient correction algorithm is not the same as the operation frequency $F_{SAMP}$ of the main oscillation circuit. Accordingly, an operation frequency of the $\Sigma\Delta$ modulation circuit may be decreased to $F_{SAMP}/R$, where the coefficient renewal sampling cycle R may be an arbitrary rational number equal to or larger than 1.

4th Exemplary Embodiment

Figure 8:
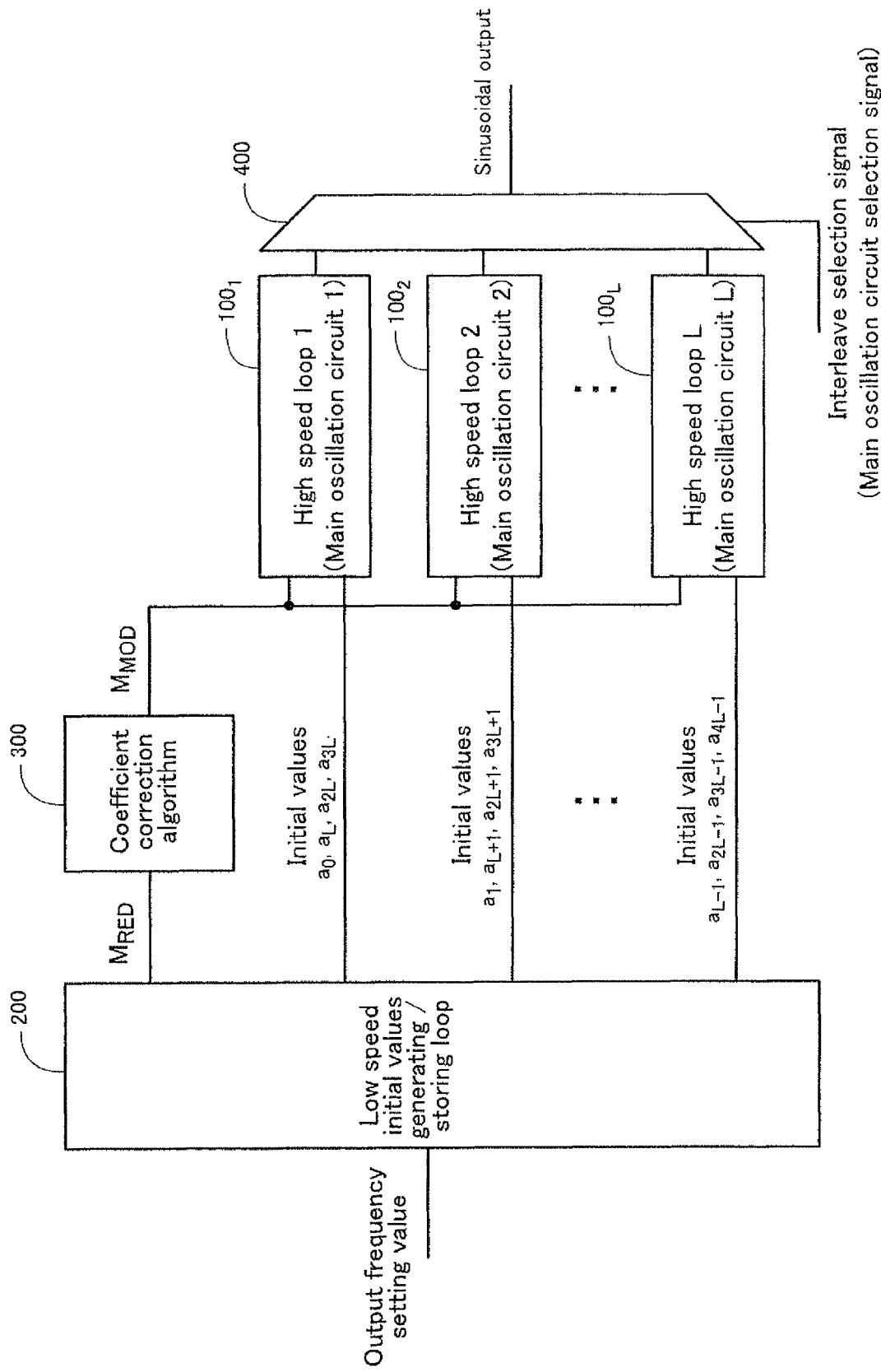
FIG. 8 is a block diagram of the fourth exemplary numerically controlled oscillator of this disclosure.
Figure 9A:
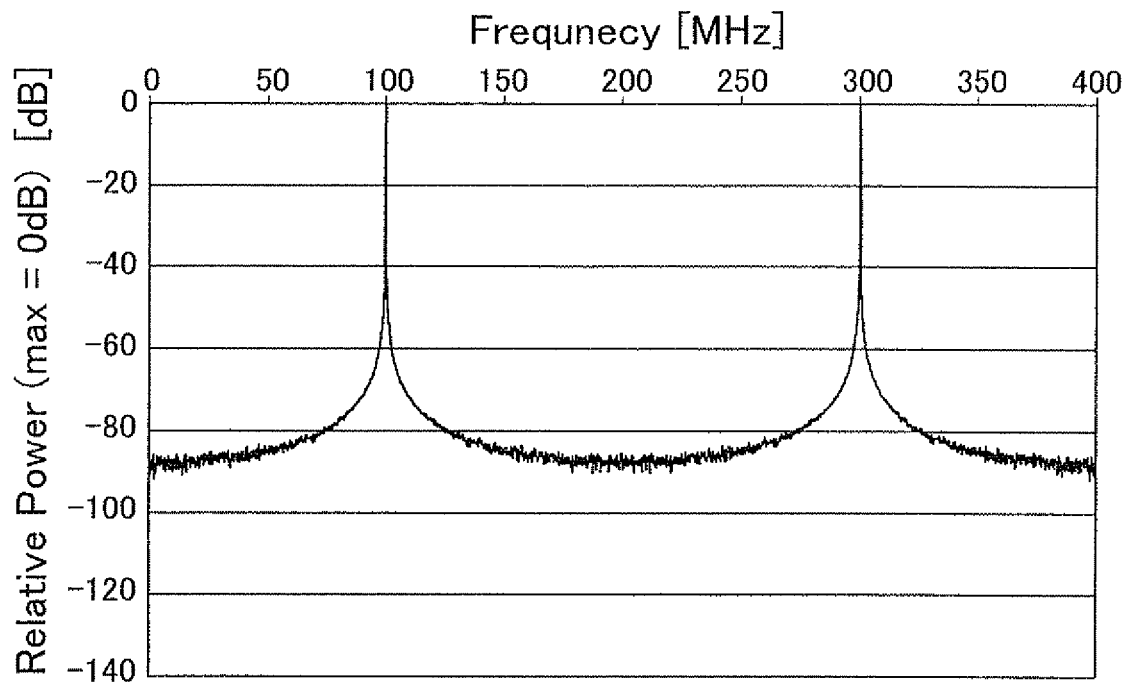
FIG. 9A is a power spectrum of output sinusoidal wave values without dynamic coefficient correction algorithm.
Figure 9B:
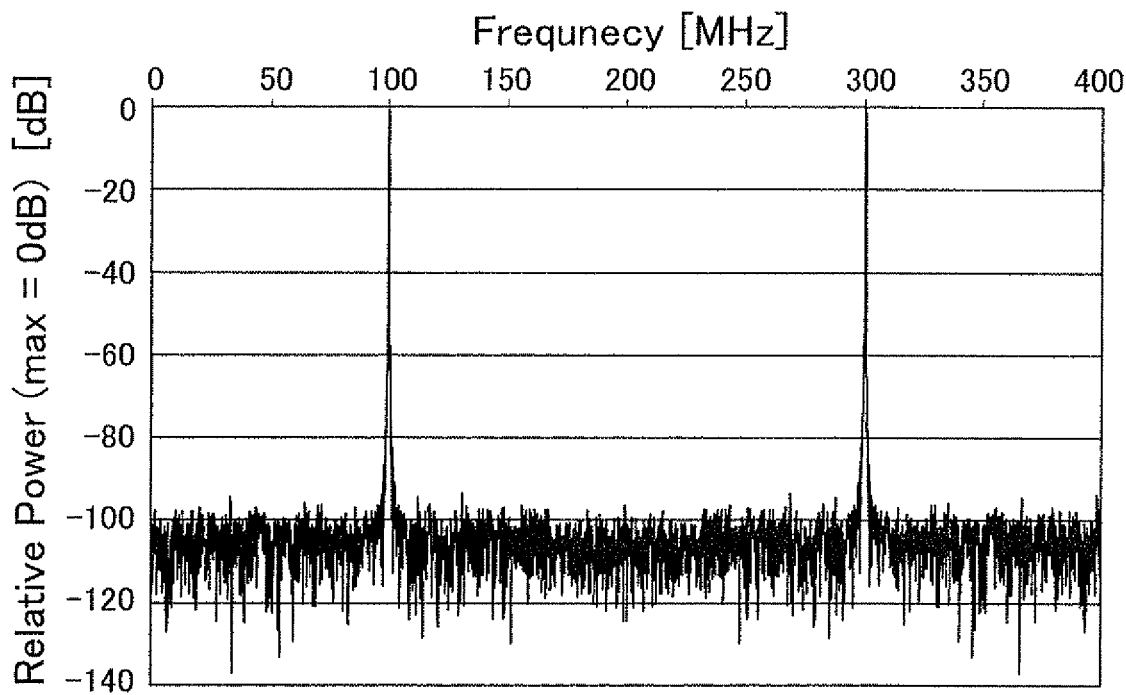
FIG. 9B is a power spectrum of output sinusoidal wave values with dynamic coefficient correction algorithm.

FIGS. 8, 9A and 9B

Various exemplary embodiments of this disclosure enable to expand an upper limit of oscillation frequency by increasing the time margin for the operation of multiplier. Generating and interleaving function values at phases with $\Delta\omega^*L$ intervals successively shifted by $\Delta\omega$ enable to further increase the maximum oscillation frequency. Further, re-supplying of the initial values and correction of the coefficient by evaluating the accumulation of quantization errors enables to decrease the amount of accumulated error. Thereby, oscillation of signals with high spectrum purity is realized.

FIG. 8 shows an exemplary high-speed numerically controlled oscillator that incorporates each of the features described above, i.e., i) high-speed main sinusoidal wave oscillation circuits $100_1$ to $100_L$ each implements a trigonometric identity between four or more successive terms as a recurrence equation and includes a pipelined multiplier, ii) an interleaving structure 400 implementing a plurality of recurrence equation loops, iii) a coefficient correction algorithm having a $\Sigma\Delta$ modulation circuit 300, and iv) a low-speed initial value generating/storing block 200 that calculates and stores, during a period such as a start-up period, initial values $a_0, \ldots a_{4L-1}$ to be supplied to the main oscillation circuits and an input to the coefficient correction algorithm $M_{RED}$. The selector 400 is controlled by an interleave selection signal and selects one of the outputs of main oscillation circuits $100_1$ to $100_L$.

Specifically, an embodiment was constructed with following parameters, and a spectrum purity of output sinusoidal wave was evaluated by using a discrete fast Fourier transform (FFT). A number of sample points evaluated by discrete FFT was 4096, and a Blackman window was used. The gap in the sequence of sinusoidal wave values caused by re-supplying the initial values is set at the center of the window so that the effect of dynamic coefficient correction algorithm is emphasized. FIG. 9A shows a power spectrum of output sinusoidal wave values without the dynamic coefficient correction algorithm and FIG. 9B shows a power spectrum of output sinusoidal wave values with the dynamic coefficient correction algorithm.

A. Number of high-speed main sinusoidal wave oscillation circuits that are interleaved is 2 (L=2).
B. Sampling frequency for each main oscillation circuit is 200 MHz, or a total sampling frequency of the interleaved oscillators is 400 MHz.
C. Each value in the sequence of sinusoidal wave values $a_n$ ranges from −1 to 1 and has 22 bits quantization resolution including one sign bit.
D. Coefficients $M_-$ or $M_+$ supplied to the high-speed main oscillation circuit ranges from −2 to 2 and has 24 bits quantization resolution including one sign bit. However, the oscillation circuit is stable only when the coefficient is between −2 and 0.
E. Input to $\Sigma\Delta$ modulation circuit in the dynamic coefficient correction algorithm ranges from 0 to 1 and has a bit length of 4 bits not including one sign bit.
F. Coefficient renewal sampling cycle R of the dynamic coefficient correction algorithm is 16 (R=16).
G. Sequence of output sinusoidal wave $a_n$ has a cycle of 63200 sampling periods (E=63200).
H. Initial values input to the numerically controlled oscillator are set such that the frequency of output sinusoidal wave is $400 \times 15761/63200 \cong 99.75$ MHz. Accordingly, sequence of output sinusoidal wave values has a cycle of 63200 sampling periods with 400 MHz sampling rate.
I. Sinusoidal output signal is rounded into 12 bits including one sign bit.

FIG. 9A indicates that, when the dynamic coefficient correction algorithm is not employed, the frequency spectrum significantly spreads around the desired output tone. The spread may not be acceptable for most applications. The dynamic coefficient correction algorithm effectively suppresses the spread in the frequency spectrum as shown in FIG. 9B. That is, the dynamic coefficient correction algorithm enables to generate output sinusoidal wave with a narrow tone, or output sinusoidal wave with high spectrum purity.

Other Exemplary Embodiments

Various exemplary embodiments described above generate sinusoidal waves by using recurrence equations (7) and (8) derived from trigonometric identities (5) and (6) between cosine values at successive cycles. However, it is also possible to use recurrence equations derived from other forms of trigonometric identities. For example, it is possible to use a recurrence equation derived from following identity (3') between sine values at successive cycles instead of the identity (3).

$$\sin(\omega+(n+1)\Delta\omega)=2\cos(\Delta\omega)\sin(\omega+n\Delta\omega)-\sin(\omega+(n-1)\Delta\omega) \quad (3')$$

In either case, the same wave signal is generated except that the initial phase is different by 90°. Accordingly, it is described that "sinusoidal wave is generated" even in exemplary embodiments in which recurrence equations derived from trigonometric identities between cosine values at successive cycles are used. The situations are the same when recurrence equations between four or more successive terms are used.

Here, 6th order recurrence equations between seven successive terms, i.e., terms including respective ones of the function values $a_{n-5}, a_{n-4}, a_{n-3}, a_{n-2}, a_{n-1}, a_n, a_{n+1}$ generated in seven successive cycles, are explained. Basically, recurrence equations between arbitrary numbers of successive terms, which may be used for generating sinusoidal waves, may be derived from following trigonometric identities (14), which are known as trigonometric sum and difference identities.

$$\sin\alpha+\sin\beta=2\sin((\alpha+\beta)/2)\cos((\alpha-\beta)/2)$$

$$\sin\alpha-\sin\beta=2\cos((\alpha+\beta)/2)\sin((\alpha-\beta)/2)$$

$$\cos\alpha+\cos\beta=2\cos((\alpha+\beta)/2)\cos((\alpha-\beta)/2)$$

$$\cos\alpha+\cos\beta=-2\sin((\alpha+\beta)/2)\sin((\alpha-\beta)/2) \quad (14)$$

The first identity and the first recurrence equation between seven successive terms are as follows:

$$\cos(\omega + (n+1)\Delta\omega) = -\cos(\omega + n\Delta\omega) - \cos(\omega + (n-1)\Delta\omega) + \\ 2\{\cos(3\Delta\omega) + \cos(2\Delta\omega) + \cos(\Delta\omega)\}\cos(\omega + (n-2)\Delta\omega) - \\ \cos(\omega + (n-3)\Delta\omega) - \cos(\omega + (n-4)\Delta\omega) - \cos(\omega + (n-5)\Delta\omega)$$ (15)

$$a_{n+1} = -a_n - a_{n-1} + M_{7++}a_{n-2} - a_{n-3} - a_{n-4} - a_{n-5}$$ (16)

Here, $a_n = \cos(\omega + n\Delta\omega)$ and $M_{7++} = 2\{\cos(3\Delta\omega) + \cos(2\Delta\omega) + \cos(\Delta\Omega)\}$.

The second identity and the second recurrence equation are as follows:

$$\cos(\omega + (n+1)\Delta\omega) = -\cos(\omega + n\Delta\omega) + \cos(\omega + (n-1)\Delta\omega) + \\ 2\{\cos(3\Delta\omega) + \cos(2\Delta\omega) - \cos(\Delta\omega)\}\cos(\omega + (n-2)\Delta\omega) + \\ \cos(\omega + (n-3)\Delta\omega) - \cos(\omega + (n-4)\Delta\omega) - \cos(\omega + (n-5)\Delta\omega)$$ (17)

$$a_{n+1} = -a_n - a_{n-1} + M_{7+-}a_{n-2} + a_{n-3} - a_{n-4} - a_{n-5}$$ (18)

Here, $a_n = \cos(\omega \times n\Delta\omega)$ and $M_{7+-} = 2\{\cos(3\Delta\omega) + \cos(2\Delta\omega) - \cos(\Delta\omega)\}$.

The third identity and the third recurrence equation are as follows:

$$\cos(\omega + (n+1)\Delta\omega) = \cos(\omega + n\Delta\omega) - \cos(\omega + (n-1)\Delta\omega) + \\ 2\{\cos(3\Delta\omega) - \cos(2\Delta\omega) + \cos(\Delta\omega)\}\cos(\omega + (n-2)\Delta\omega) - \\ \cos(\omega + (n-3)\Delta\omega) + \cos(\omega + (n-4)\Delta\omega) - \cos(\omega + (n-5)\Delta\omega)$$ (19)

$$a_{n+1} = -a_n - a_{n-1} + M_{7-+}a_{n-2} - a_{n-3} - a_{n-4} - a_{n-5}$$ (20)

Here, $a_n = \cos(\omega + n\Delta\omega)$ and $M_{7-+} = 2\{\cos(3\Delta\omega) - \cos(2\Delta\omega) + \cos(\Delta\omega)\}$.

The fourth identity and the fourth recurrence equation are as follows:

$$\cos(\omega + (n+1)\Delta\omega) = \cos(\omega + n\Delta\omega) + \cos(\omega + (n-1)\Delta\omega) + \\ 2\{\cos(3\Delta\omega) - \cos(2\Delta\omega) - \cos(\Delta\omega)\}\cos(\omega + (n-2)\Delta\omega) + \\ \cos(\omega + (n-3)\Delta\omega) + \cos(\omega + (n-4)\Delta\omega) - \cos(\omega + (n-5)\Delta\omega)$$ (21)

$$a_{n+1} = a_n - a_{n-1} + M_{7--}a_{n-2} + a_{n-3} + a_{n-4} - a_{n-5}$$ (22)

Here, $a_n = \cos(\omega n\Delta\omega)$ and $M_{7--} = 2\{\cos(3\Delta\omega) - \cos(2\Delta\omega) - \cos(\Delta\omega)\}$.

In the exemplary numerically controlled oscillator shown in FIG. 3, sinusoidal wave is generated by using 4th order recurrence equations (7) or (8) between five successive terms including the term $M_- a_{n-1}$ or $M_+ a_{n-1}$. The term needs a multiplication of a coefficient $M_-$ or $M_+$ and a function value $a_{n-1}$ generated in the sampling period n−1, which is two periods before the current period n+1, or in a clock cycle that is two cycles before the current cycle when the delay elements are implemented with flip-flops. Accordingly, output of the adder 31 is input to the multiplier 21 having a latency of 1-clock cycle after passing through one delay element 11.

When the 6th order recurrence equations (16), (18), (20), or (22) between seven successive terms is used to generate sinusoidal wave, a multiplication between a coefficient and $a_{n-2}$, or a function value generated in a clock cycle n−2, which is three cycles before the current cycle n+1, is needed. Furthermore, various exemplary embodiments of this disclosure may generate sinusoidal and various other wave forms by using various recurrence equations including various numbers of successive terms provided that the theorem (1) is satisfied.

In such cases, multiplications between coefficients and terms other than $a_{n-1}$ and $a_{n-2}$ including function values generated in earlier clock cycles may be required. Further, depending on the required oscillation frequency, multiplier having a latency of two or more clock cycles may be used. According to various exemplary embodiments of this disclosure, a signal to be input to a multiplier may be selected depending on the clock cycle in which the function value to be multiplied is generated and the latency of the multiplier.

For example, in the exemplary numerically controlled oscillator shown in FIG. 3, output of the adder 31 is input to the multiplier 21 after delayed by one delay element. In this case, when the multiplier 21 has a latency of one clock cycle, a function value generated in sampling period n−1, which is two sampling periods before the current period n+1, is input to the multiplier 21. Accordingly, generation of a function value using a recurrence equation including a term of $a_{n-1}$ multiplied by a coefficient is enabled.

When the multiplier 21 has a latency of two clock cycles, a function value generated in a sampling period n−2, which is three periods before the current period n+1, is input to the multiplier 21. Accordingly, generation of a function value using a recurrence equation including a term of $a_{n-2}$ multiplied by a coefficient is enabled. When the multiplier 21 has a latency of three clock cycles, a function value generated in sampling period n−3, which is four sampling periods before the current period n+1, is input to the multiplier 21, and generation of a function value using a recurrence equation including a term of $a_{n-3}$ multiplied by a coefficient is enabled.

When output of the adder 31 is input to the multiplier 21 after delayed by two delay elements and the multiplier 21 has a latency of one clock cycle, a function value generated in a sampling period n−2, which is three sampling periods before the current period n+1, is input to the multiplier 21, and generation of a function value using a recurrence equation including a term of $a_{n-2}$ multiplied by a coefficient is enabled. When the multiplier 21 has a latency of three clock cycles, a function value generated in a sampling period n−3, which is four sampling periods before the current period n+1, is input to the multiplier 21, and generation of a function value using a recurrence equation including a term $a_{n-3}$ multiplied by a coefficient is enabled.

When output of the adder 31 is input to the multiplier 21 after delayed by three delay elements and the multiplier 21 has a latency of one clock cycles, a function value generated in a sampling period n−3, which is four sampling periods before the current period n+1, is input to the multiplier 21, and generation of a function value using a recurrence equation including a term of $a_{n-3}$ multiplied by a coefficient is enabled.

In the exemplary numerically controlled oscillator shown in FIG. 3, each of the calculators 51 and 52 performs a calculation of *1 or *(−1). These simple calculations may be executed in one clock cycle. When various other recurrence equations are used, the calculator may execute other simple calculations such as *2 or *½, which may be executed by a bit-shift. That is, in various exemplary embodiments of this disclosure, an adder may add function values after various simple calculations in calculators.

The exemplary numerically controlled oscillator shown in FIG. 3 generates sinusoidal wave signal using recurrence equations (7) and (8) that define the function value of the current cycle n+1 using function values of successive cycles that are one to four cycles before the current cycle. Specifically, recurrence equations (7) and (8) include terms including respective ones of the function values of current and four previous cycles, and none of the coefficients of these terms is zero. Accordingly, the adder 31 adds all of the function values generated in four successive cycles before the current cycle as they are, after the sign thereof is inverted in the calculator 51 or 52, or after multiplied with a coefficient in the multiplier 21.

Various exemplary embodiments of this disclosure may generate various wave forms by using various recurrence equations including various numbers of successive terms with various coefficients. The various recurrent equations may define the function value of the current cycle using function values of some, but not all, of a certain number of successive cycles before the current cycle. When the numerically controlled oscillator uses such an equation, an adder that constitutes an oscillation circuit of the numerically controlled oscillator adds only some, but not all, of the function values generated in the certain number of successive cycles.

What is claimed is:

1. A numerically controlled oscillator for generating function values in respective clock cycles by using a recurrence equation, comprising:
    an oscillation circuit including
        a multiplier having a latency of k clock cycles and an adder, wherein the oscillation circuit generates, in each of the clock cycles, a current one of the function values by multiplying, using the multiplier, a first one of the function values by a coefficient, the first one of the function values being generated in a first one of the clock cycles that is one of the clock cycles j cycle(s) ago from a current one of the clock cycles and adding, using the adder, an output of the multiplier and at least one of the function values generated in previous ones of the clock cycles that are 1 to i−1 cycles before the current one of the clock cycles excluding the first one of the clock cycles,
        where i is an integer greater than 2, j is an integer greater than 1 and less than i, and k is an integer greater than 0 and less than j; and
    a coefficient generation circuit that generates and supplies the coefficient to the oscillation circuit, wherein
    the oscillation circuit further includes i−1 stages of delay elements that successively delay the current one of the function values for one clock cycle in each of the stages, and an output of (j−k)th one of the delay elements is input to the multiplier; and
    an output of jth of the delay elements is not input to the multiplier.

2. The numerically controlled oscillator according to claim 1, wherein:
    the coefficient generation circuit generates the coefficient using a calculation formula selected from a plurality of formulae based on an oscillation frequency of the oscillation circuit.

3. The numerically controlled oscillator according to claim 1, wherein:
    the coefficient generation circuit generates an internal coefficient including an upper portion having a first number of bits required by the multiplier and a lower portion having redundant bits; and
    the coefficient generation circuit further includes a correction circuit that receives the internal coefficient, evaluates an accumulation of errors while the oscillation circuit generates the function values based on the lower portion of the internal coefficient to generate a correction value, and corrects the upper portion of the internal coefficient using the correction value to generate the coefficient having the first number of bits.

4. The numerically controlled oscillator according to claim 1, further comprising:
    an initial value generation circuit that generates and supplies initial values to the oscillation circuit so that the oscillation circuit starts generating the function values from the initial values,
    wherein the initial value generation circuit re-supplies the initial values to the oscillation circuit when the clock cycle reaches to a returning clock cycle at which the function values are supposed to return to the initial values so that the oscillation circuit re-starts generating the function values from the initial values.

5. The numerically controlled oscillator according to claim 4, wherein:
    the coefficient generation circuit generates an internal coefficient including an upper portion having a first number of bits required by the multiplier and a lower portion having redundant bits; and
    the coefficient generation circuit further includes a correction circuit that receives the internal coefficient, evaluates an accumulation or errors while the oscillation circuit generates the function values based on the lower portion of the internal coefficient to generate a correction value, and corrects the upper portion of the internal coefficient using the correction value to generate the coefficient having the first number of bits.

6. The numerically controlled oscillator according to claim 1, wherein:
    the oscillation circuit includes L oscillation circuits that generate the function values at phases successively shifted by $\Delta\omega$, each of the L oscillation circuits generates the function values at phases with an interval of $\Delta\omega*L$, where L is an integer greater than 1, and
    the numerically controlled oscillator generates the function values at phases with an interval of $\Delta\omega$ by interleaving the function values generated by the L oscillation circuits.

7. The numerically controlled oscillator according to claim 1, wherein the function values are sinusoidal function values.

8. The numerically controlled oscillator according to claim 7, wherein:
    the coefficient generation circuit generates the coefficient using a calculation formula selected from a plurality of formulae based on an oscillation frequency of the oscillation circuit.

9. The numerically controlled oscillator according to claim 7, wherein:
    the oscillation circuit generates the sinusoidal function values at phases with an interval of $\Delta\omega$;
    i=5 and j=2; and
    the coefficient is $M-=2\{\cos(2\Delta\omega)-\cos(\Delta\omega)\}$ and the adder adds two of the function values generated in two of the previous ones of the clock cycles that are one cycle before the current one of the clock cycles and three cycles before the current one of the clock cycles as they are and further adds one of the function values generated in one of the previous ones of the clock cycles that is four cycles before the current one of the clock cycles after a sign thereof is inverted; or
    the coefficient is $M+=2\{\cos(2\Delta\omega))+\cos(\Delta\omega)\}$ and the adder adds three of the function values generated in three of the previous ones of the clock cycles that are one cycle before the current one of the clock cycles, three cycles before the current one of the clock cycles, and four cycles before the current one of the clock cycles after signs thereof are inverted.

10. The numerically controlled oscillator according to claim 7, wherein:
the coefficient generation circuit generates an internal coefficient including an upper portion having a first number of bits required by the multiplier and a lower portion having redundant bits; and
the coefficient generation circuit further includes a correction circuit that receives the internal coefficient, evaluates an accumulation of errors while the oscillation circuit generates the function values based on the lower portion of the internal coefficient to generate a correction value, and corrects the upper portion of the internal coefficient using the correction value to generate the coefficient having the first number of bits.

11. The numerically controlled oscillator according to claim 7, further comprising:
an initial value generation circuit that generates and supplies initial values to the oscillation circuit so that the oscillation circuit starts generating the function values from the initial values,
wherein the initial value generation circuit re-supplies the initial values to the oscillation circuit when the clock cycle reaches to a returning clock cycle at which the function values are supposed to return to the initial values so that the oscillation circuit re-starts generating the function values from the initial values.

12. The numerically controlled oscillator according to claim 11, wherein:
the coefficient generation circuit generates an internal coefficient including an upper portion having a first number of bits required by the multiplier and a lower portion having redundant bits; and
the coefficient generation circuit further includes a correction circuit that receives the internal coefficient, evaluates an accumulation of errors while the oscillation circuit generates the function values based on the lower portion of the internal coefficient to generate a correction value, and corrects the upper portion of the internal coefficient using the correction value to generate the coefficient having the first number of bits.

13. The numerically controlled oscillator according to claim 7, wherein:
the oscillation circuit includes L oscillation circuits that generate the function values at phases successively shifted by $\Delta\omega$, each of the L oscillation circuits generates the function values at phases with an interval of $\Delta\omega*L$, where L is an integer greater than 1; and
the numerically controlled oscillator generates the function values at phases with an interval of $\Delta\omega$ by interleaving the function values generated by the L oscillation circuits.

14. The numerically controlled oscillator according to claim 1, wherein the at least one of the function values generated in the previous ones of the clock cycles has been weighted without delay.

15. A numerically controlled oscillator for generating function values in respective clock cycles by using a recurrence equation, comprising:
an oscillation circuit including
a multiplier having a latency of k clock cycles and an adder, wherein the oscillation circuit generates, in each of the clock cycles, a current one of the function values by multiplying, using the multiplier, a first one of the function values by a coefficient, the first one of the function values being generated in a first one of the clock cycles that is one of the clock cycles j cycle(s) ago from a current one of the clock cycles and adding, using the adder, an output of the multiplier and at least one of the function values generated in previous ones of the clock cycles that are 1 to i−1 cycles before the current one of the clock cycles excluding the first one of the clock cycles,
where i is an integer greater than 2, j is an integer greater than 1 and less than i, and k is an integer greater than 0 and less than j; and
a coefficient generation circuit that generates and supplies the coefficient to the oscillation circuit, wherein
the oscillation circuit generates sinusoidal function values at phases with an interval of $\Delta\omega$ as the function values; i=5 and j=2; and
the coefficient is M−=2 $\{\cos(2\Delta\omega)-\cos(\Delta\omega)\}$ and the adder adds two of the function values generated in two of the previous ones of the clock cycles that are one cycle before the current one of the clock cycles and three cycles before the current one of the clock cycles as they are and further adds one of the function values generated in one of the previous ones of the clock cycles that is four cycles before the current one of the clock cycles after a sign thereof is inverted; or
the coefficient is M+=2 $\{\cos(2\Delta\omega))+\cos(\Delta\omega)\}$ and the adder adds three of the function values generated in three of the previous ones of the clock cycles that are one cycle before the current one of the clock cycles, three cycles before the current one of the clock cycles, and four cycles before the current one of the clock cycles after signs thereof are inverted.

16. A numerically controlled oscillator for generating function values in respective clock cycles by using a recurrence equation, comprising:
an oscillation circuit including
a multiplier having a latency of k clock cycles and an adder, wherein the oscillation circuit generates, in each of the clock cycles, a current one of the function values by multiplying, using the multiplier, a first one of the function values by a coefficient, the first one of the function values being generated in a first one of the clock cycles that is one of the clock cycles j cycle(s) ago from a current one of the clock cycles and adding, using the adder, an output of the multiplier and at least one of the function values generated in previous ones of the clock cycles that are 1 to i−1 cycles before the current one of the clock cycles excluding the first one of the clock cycles,
where i is an integer greater than 2, j is an integer greater than 1 and less than i, and k is an integer greater than 0 and less than j; and
a coefficient generation circuit that generates and supplies the coefficient to the oscillation circuit, wherein:
the oscillation circuit generates sinusoidal function values at phases with an interval of $\Delta\omega$ as the function values; i=5 and j=2; and
the coefficient is M−=2 $\{\cos(2\Delta\omega*L)\cos(\Delta\omega*L)\}$ and the adder adds two of the function values generated in two of the previous ones of the clock cycles that are one cycle before the current one of the clock cycles and three cycles before the current one of the clock cycles as they are and further adds one of the function values generated in one of the previous ones of the clock cycles that is four cycles before the current one of the clock cycles after a sign thereof is inverted; or
the coefficient is M+=2$\{\cos(2\Delta\omega*L)+\cos(\Delta\omega*L)\}$ and the adder adds three of the function values generated in three of the previous ones of the clock cycles that are one cycle before the current one of the clock cycles, three cycles before the current one of the clock cycles, and four cycles before the current one of the clock cycles after signs thereof are inverted.

17. An oscillation method for generating function values in respective clock cycles by using a recurrence equation, comprising:
   generating, via a processor, a current one of the function values in each of the clock cycles, including:
   multiplying, via the processor, a first one of the function values by a coefficient with a latency of k clock cycles, the first one of the function values being generated in a first one of the clock cycles that is one of the clock cycles j cycle(s) ago from a current one of the clock cycles; and
   adding, via the processor an result of the multiplying and at least one of the function values generated in previous ones of the clock cycles that are 1 to i−1 cycles before the current one of the clock cycles excluding the first one of the clock cycles, where i is an integer greater than 2, j is an integer greater than 1 and less than i, and k is an integer greater than 0 and less than j, wherein
   the multiplying includes receiving the current one of the function values after delaying for j−k clock cycles as the first one of the function values.

18. The oscillation method according to claim 17, further comprising generating the coefficient using a calculation formula selected from a plurality of formulae based on an oscillation frequency of the oscillation circuit.

19. The oscillation method according to claim 17, wherein the function values are sinusoidal function values.

20. The oscillation method according to claim 17, further comprising:
   generating an internal coefficient including an upper portion having a first number of bits required as the coefficient and a lower portion having redundant bits; and
   evaluating an accumulation of errors while generating the function values based on the lower portion of the internal coefficient to generate a correction value, and correcting the upper portion of the internal coefficient using the correction value to generate the coefficient having the first number of bits.

21. The oscillation method according to claim 17, further comprising:
   supplying initial values so that the generating of the function values starts from the initial values; and
   re-supplying the initial values when the clock cycle reaches to a returning clock cycle at which the function values are supposed to return to the initial values so that the generating re-starts from the initial values.

22. The oscillation method according to claim 21, further comprising:
   generating an internal coefficient including an upper portion having a first number of bits required as the coefficient and a lower portion having redundant bits; and
   evaluating an accumulation of errors while generating the function values based on the lower portion of the internal coefficient to generate a correction value, and correcting the upper portion of the internal coefficient using the correction value to generate the coefficient having the first number of bits.

23. The oscillation method according to claim 17, wherein the generating of the function values includes:
   generating L sets of the function values at phases successively shifted by $\Delta\omega$, each of the sets including the function values at phases with an interval of $\Delta\omega*L$, where L is an integer greater than 1, and
   generating the function values at phases with an interval of $\Delta\omega$ by interleaving the L sets of function values.

24. The oscillation method according to claim 17, wherein the at least one of the function values generated in the previous ones of the clock cycles has been weighted without delay.

* * * * *